(12) United States Patent
Asahi

(10) Patent No.: US 9,881,860 B2
(45) Date of Patent: Jan. 30, 2018

(54) METHOD FOR PRODUCING WAVEGUIDE SUBSTRATE

(71) Applicant: FUJIKURA LTD., Tokyo (JP)

(72) Inventor: Kan Asahi, Sakura (JP)

(73) Assignee: FUJIKURA LTD., Tokyo (JP)

( * ) Notice: Subject to any disclaimer, the term of this patent is extended or adjusted under 35 U.S.C. 154(b) by 0 days.

(21) Appl. No.: 15/178,764

(22) Filed: Jun. 10, 2016

(65) Prior Publication Data

US 2016/0372373 A1 Dec. 22, 2016

(30) Foreign Application Priority Data

Jun. 17, 2015 (JP) .................................. 2015-122402
Dec. 18, 2015 (JP) .................................. 2015-247607

(51) Int. Cl.
| | |
|---|---|
| *H01L 21/44* | (2006.01) |
| *H01L 23/498* | (2006.01) |
| *H01L 21/48* | (2006.01) |
| *H01L 23/66* | (2006.01) |
| *G02B 6/00* | (2006.01) |
| *H01P 3/12* | (2006.01) |
| *H01P 5/107* | (2006.01) |

(52) U.S. Cl.
CPC .......... *H01L 23/49827* (2013.01); *G02B 6/00* (2013.01); *H01L 21/4846* (2013.01); *H01L 23/66* (2013.01); *H01P 3/121* (2013.01); *H01P 5/107* (2013.01)

(58) Field of Classification Search
CPC ....... H05K 1/0251; H01P 5/103; H01P 5/107; H01P 7/065; H01L 45/02

USPC .......................................................... 438/667
See application file for complete search history.

(56) References Cited

U.S. PATENT DOCUMENTS

| | | | |
|---|---|---|---|
| 2004/0092117 | A1 | 5/2004 | Suemasu et al. |
| 2005/0064707 | A1 | 3/2005 | Sinha |

(Continued)

FOREIGN PATENT DOCUMENTS

| | | | |
|---|---|---|---|
| JP | 2002-158191 A | 5/2002 | |
| JP | 2004-158705 A | 6/2004 | |
| JP | 2007-520051 A | 7/2007 | |

(Continued)

OTHER PUBLICATIONS

Notice of Allowance dated Apr. 12, 2016, Issued in Counterpart of Japanese Application No. JP2015-247607 (1 page).

*Primary Examiner* — Brook Kebede

(74) *Attorney, Agent, or Firm* — Westerman, Hattori, Daniels & Adrian, LLP

(57) ABSTRACT

To allow a metal film to have a sufficient thickness around a bottom surface of a non-through hole and prevent the metal film from being peeled from a substrate surface, a method for producing a waveguide substrate includes forming a first metal film on (i) a first main surface of a substrate, at which first main surface a non-through hole opens, and on (ii) an inner wall of the non-through hole, forming resist on a first main surface side of the substrate in such a manner that the resist blocks the opening of the non-through hole, removing a first portion of the first metal film which first portion is on the first main surface, removing the resist, and forming a second metal film on the first main surface of the substrate in a state where the first metal film is present on the inner wall of the non-through hole.

4 Claims, 6 Drawing Sheets

(56) References Cited

U.S. PATENT DOCUMENTS

2011/0267152 A1\* 11/2011 Lee ..................... H01P 5/103
333/26
2015/0349398 A1 12/2015 Uemichi

FOREIGN PATENT DOCUMENTS

| JP | 2010-147145 A | 7/2010 | |
|---|---|---|---|
| JP | 2011-109438 A | 6/2011 | |
| JP | WO 2014104336 A1 \* | 7/2014 | ............. H01P 3/121 |
| JP | 2014-158243 A | 8/2014 | |
| JP | 2014158243 A \* | 8/2014 | ........... H05K 1/0251 |
| JP | WO 2014126194 A1 \* | 8/2014 | ........... H05K 1/0251 |
| JP | 2014-236291 A | 12/2014 | |
| JP | 2015-76836 A | 4/2015 | |

\* cited by examiner

METHOD FOR PRODUCING WAVEGUIDE SUBSTRATE

This Nonprovisional application claims priority under 35 U.S.C. §119 on Patent Application No. 2015-247607 filed in Japan on Dec. 18, 2015 and Patent Application No. 2015-122402 filed in Japan on Jun. 17, 2015, the entire contents of which are hereby incorporated by reference.

TECHNICAL FIELD

The present invention relates to a method for producing a waveguide substrate.

BACKGROUND ART

A known mode of an inexpensive and compact millimeter-wave communication module is a millimeter-wave communication module including a post-wall waveguide (hereinafter referred to also as "PWW") (see, for example, Patent Literature 1).

A PPW includes a printed circuit board having a front surface and a back surface each provided with an earth conductor, the printed circuit board containing a plurality of conductor columns serving as post walls and arranged in such a manner as to stand between the earth conductor layers. The conductor columns correspond to metal sidewalls of a conventional waveguide. A millimeter-wave communication module including a PPW is configured such that (i) a wireless telecommunication IC mounted on the substrate of the PWW is, for example, wire-bonded or bump-connected to a transmission line (for example, a microstrip line, a coplanar line, or a strip line) and that (ii) a conductor pin connected to the transmission line and serving as a power feeding section is inserted in the PPW. This configuration causes a millimeter wave signal outputted by the wireless telecommunication IC to propagate through the transmission line via the pin to be finally guided to the PPW.

The conductor pin inserted in the PPW is made of (i) a metal film disposed on the entire inner wall of a non-through hole in the substrate or (ii) metal filling such a non-through hole. There have been known methods for, in the case where the conductor pin is made of a metal film, forming a metal film simultaneously with the formation of an earth electrode for the PPW. An example method is a method including (i) forming a non-through hole in a substrate, (ii) forming a metal film by sputtering from the side of the opening of the non-through hole on a surface of the substrate and on the inner wall of the non-through hole, and (iii) performing a plating process to simultaneously form a metal film for an earth electrode and a metal film for a conductor pin.

CITATION LIST

Patent Literature 1

Japanese Patent Application Publication, Tokukai, No. 2011-109438 A (Publication Date: Jun. 2, 2011)

SUMMARY OF INVENTION

Technical Problem

In a case where a non-through hole in which a conductor pin is present has a small diameter and a high aspect ratio (for example, a hole diameter of not more than 100 μm and a depth of approximately 460 μm), it is undesirably difficult for a plating solution to reach the bottom surface of the non-through hole. This makes it impossible for the metal film to ensure a sufficient thickness around the bottom surface, with the result of lack of impedance matching.

In a case where a metal film is intended to have a sufficient thickness around the bottom surface of a non-through hole without a plating process (that is, by sputtering only), a metal film disposed on a substrate surface for an earth conductor has a thickness that is larger than necessary, with the result that the metal film is problematically peeled from the substrate easily due to the difference in expansion rate between the metal film and the substrate.

In view of the above problems, it is an object of the present invention to provide a method for producing a waveguide substrate which method includes forming a metal film simultaneously on an inner wall of a non-through hole in a substrate and on a substrate surface to allow the metal film to have a sufficient thickness around the bottom surface of the non-through hole and prevent the metal film from being peeled from the substrate surface.

Solution to Problem

A method according to an aspect of the present invention for producing a waveguide substrate is a method for producing a waveguide substrate, the waveguide substrate including: a substrate; a first earth conductor layer on a first main surface of the substrate; a second earth conductor layer on a second main surface of the substrate; a plurality of conductor columns disposed on respective inner walls of a plurality of through holes between the first earth conductor layer and the second earth conductor layer; a plane circuit for signal propagation which plane circuit is disposed on the first main surface of the substrate; and a conductor pin on an inner wall of a non-through hole opening at the first main surface of the substrate, the conductor pin being connected to the plane circuit, the method including: a first metal film forming step of forming a first metal film by sputtering on (i) the first main surface of the substrate, at which first main surface the non-through hole opens, and on (ii) the inner wall of the non-through hole; a resist forming step of forming resist on a first main surface side of the substrate in such a manner that the resist blocks the opening of the non-through hole; a metal film removing step of removing a first portion of the first metal film which first portion is on the first main surface; a resist removing step of removing the resist; and a second metal film forming step of forming a second metal film by sputtering on the first main surface of the substrate in a state where the first metal film is present on the inner wall of the non-through hole.

Advantageous Effects of Invention

The present invention provides a method for producing a waveguide substrate which method includes forming a metal film simultaneously on an inner wall of a non-through hole in a substrate and on a substrate surface to allow the metal film to have a sufficient thickness around the bottom surface of the non-through hole and prevent the metal film from being peeled from the substrate surface.

DESCRIPTION OF EMBODIMENTS

[Configuration of Waveguide Substrate]

Figure 1:
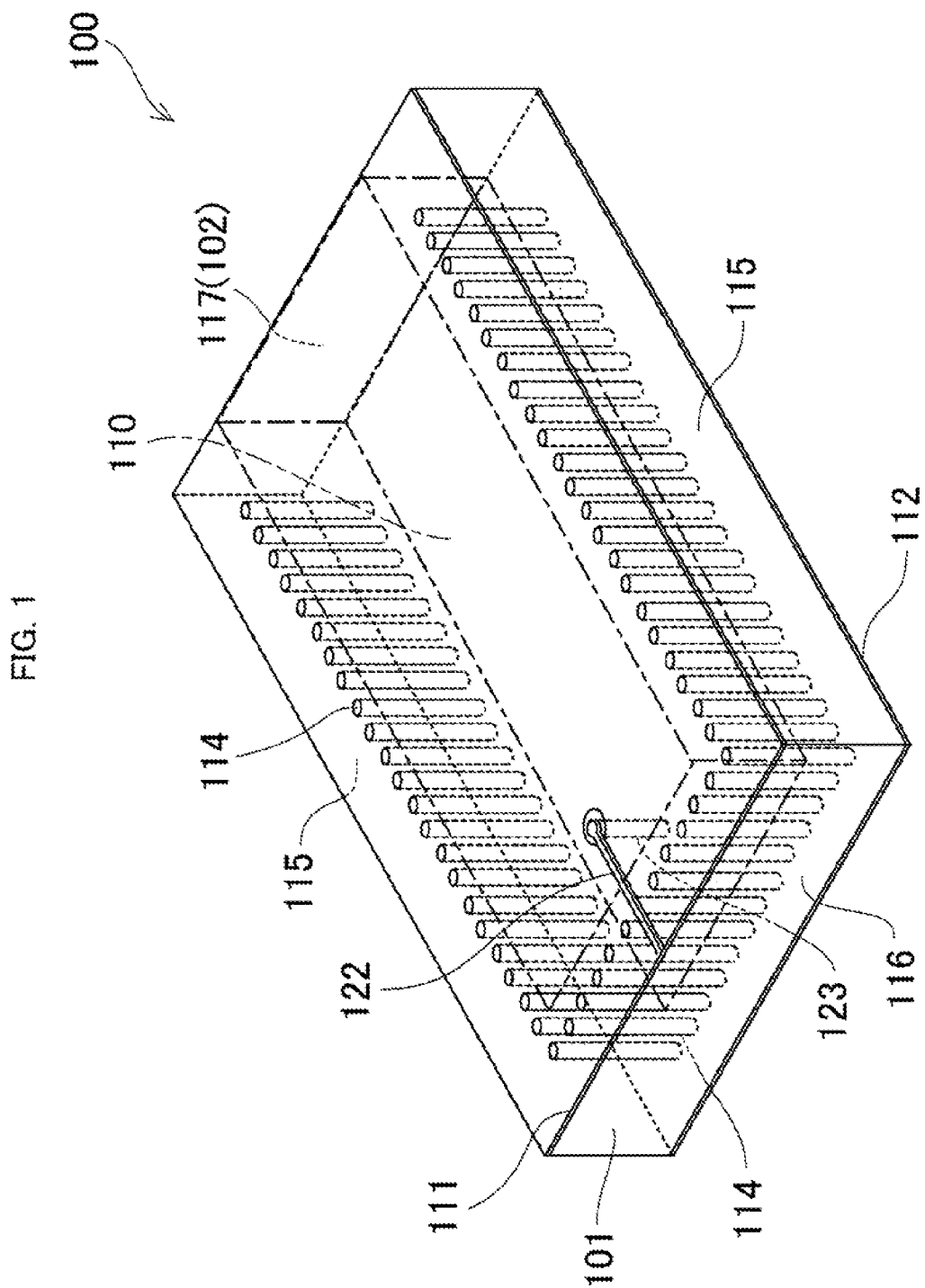
FIG. 1 is a perspective view of a waveguide substrate produced by a method according to an embodiment of the present invention for producing a waveguide substrate.
Figure 2:
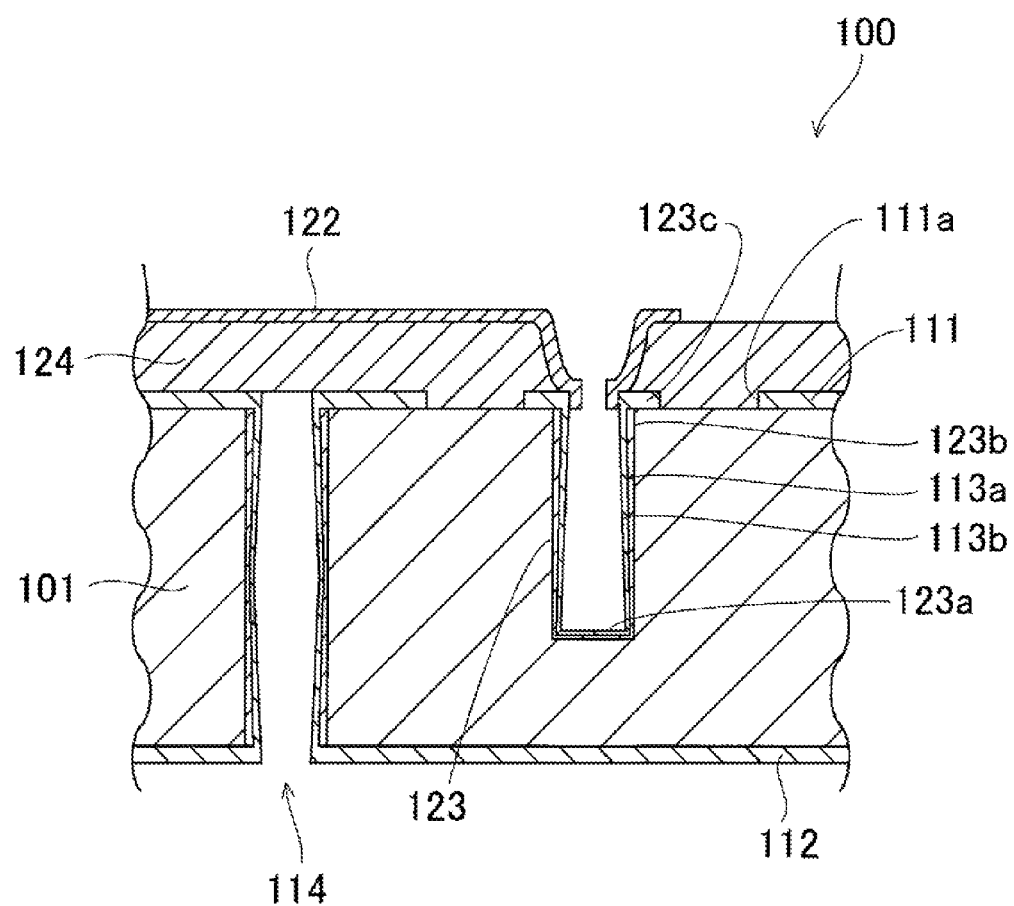
FIG. 2 is an end view of a waveguide substrate produced by a method according to an embodiment of the present invention for producing a waveguide substrate.

FIG. 1 is a perspective view of a waveguide substrate 100. FIG. 2 is an end view of the waveguide substrate 100. FIGS. 1 and 2 illustrate conductor columns 114 and a transmission line 122, which are actually not present on an identical plane as illustrated in FIG. 1, but are illustrated as being present on an identical end surface in FIG. 2 for convenience of illustration.

The waveguide substrate 100 of the present embodiment, as illustrated in FIGS. 1 and 2, includes a glass substrate 101, a transmission line (plane circuit) 122 for signal propagation, a conductor pin 123, a first earth conductor layer 111 and a second earth conductor layer 112 both connected to a ground potential, and a waveguide 110.

The glass substrate 101 is made of a single glass material. The glass substrate 101 may be replaced with a quartz substrate or a semiconductor substrate.

The waveguide 110 is a region surrounded by (i) the first earth conductor layer 111 and the second earth conductor layer 112, which are disposed respectively on a front surface and back surface of the glass substrate 101, and (ii) a plurality of conductor columns 114 that stand between the first earth conductor layer 111 and the second earth conductor layer 112 and that serve as post walls. The waveguide 110 functions as a path through which an electromagnetic wave signal emitted by the conductor pin 123 propagates. The conductor columns 114 are arranged along opposite side surfaces 115 and first end surface 116 of the glass substrate 101, and are not arranged along a second end surface 117 thereof. This means that no conductor or post wall is present on the side of the second end surface 117, allowing the second end surface 117 to serve as an opening section 102 through which an electromagnetic wave signal is emitted.

The first earth conductor layer 111 and the second earth conductor layer 112 are metal films that are made of copper and that are disposed respectively on the front surface and back surface of the glass substrate 101. The first earth conductor layer 111 and the second earth conductor layer 112 are present entirely on the front and back surfaces of the glass substrate 101 except for at least a region around the conductor pin 123.

The conductor columns 114 are metal films made of the same material as that of the first earth conductor layer 111 and the second earth conductor layer 112. The conductor columns 114 are present in a number of two or more and extend through the glass substrate 101 from the front surface to the back surface. Specifically, the conductor columns 114 are each a metal film disposed on an inner wall of a through hole that extends through the glass substrate 101 from the front surface to the back surface, the conductor column 114 having opposite ends connected respectively to the first earth conductor layer 111 and the second earth conductor layer 112. In a plan view of the glass substrate 101, the plurality of conductor columns 114 are arranged along the opposite end surfaces 115 and the first end surface 116 (not along the second end surface 117, which corresponds to the opening section 102) in a substantially rectangular shape (angled "U" shape). The plurality of conductor columns 114 are arranged and sized in such a manner that a signal emitted by the conductor pin 123 does not leak to the outside through, for example, a space between adjacent conductor columns 114.

The conductor pin 123 is disposed in such a manner as to be inserted in the waveguide 110. Specifically, the conductor pin 123 is a metal film disposed on an inner wall of a non-through hole in a region of the glass substrate 101 which region is surrounded by the region in which the conductor columns 114 are present. The conductor pin 123 is in the shape of a cylinder having a bottom. The conductor pin 123 extends in the glass substrate 101 in a direction perpendicular to the front and back surfaces of the glass substrate 101. The conductor pin 123 has a bottom part 123a at a depth that does not allow the bottom part 123a to be in contact with the second earth conductor layer 112. The conductor pin 123 has a base end 123b, at which a ring-shaped land 123c made of the same material as that of the first earth conductor layer 111 is disposed on a surface of the glass substrate 101. The land 123c is connected to the transmission line 122. Further, the land 123c is surrounded by a region in which the first earth conductor layer 111 is absent, the region serving as an opening 111a. The present embodiment is configured such that the conductor pin 123 and the conductor columns 114 each include two layers of metal films, namely a first metal film 113a and a second metal film 113b. The conductor pin 123 and the conductor columns 114 may alternatively each include three or more metal films. Further, the conductor pin 123 and the conductor columns 114, which are each illustrated as being hollow in FIG. 2, may alternatively be each a metal column with even a central portion filled with metal.

The transmission line 122, which is connected to the conductor pin 123 via the land 123c, is disposed on an insulating portion 124 on the first earth conductor layer 111. The transmission line 122 provides a circuit in a state where the transmission line 122 is insulated from the first earth conductor layer 111. The transmission line 122 is a conductive pattern made of the same material as that of the first earth conductor layer 111 and the second earth conductor layer 112. The transmission line 122 has (i) an end connected to the conductor pin 123 and (ii) an opposite end connected to a GSG pad (not shown) on the insulating portion 124. The transmission line 122 thus serves as a microstrip line.

[Method for Producing Waveguide Substrate]

Figure 3:
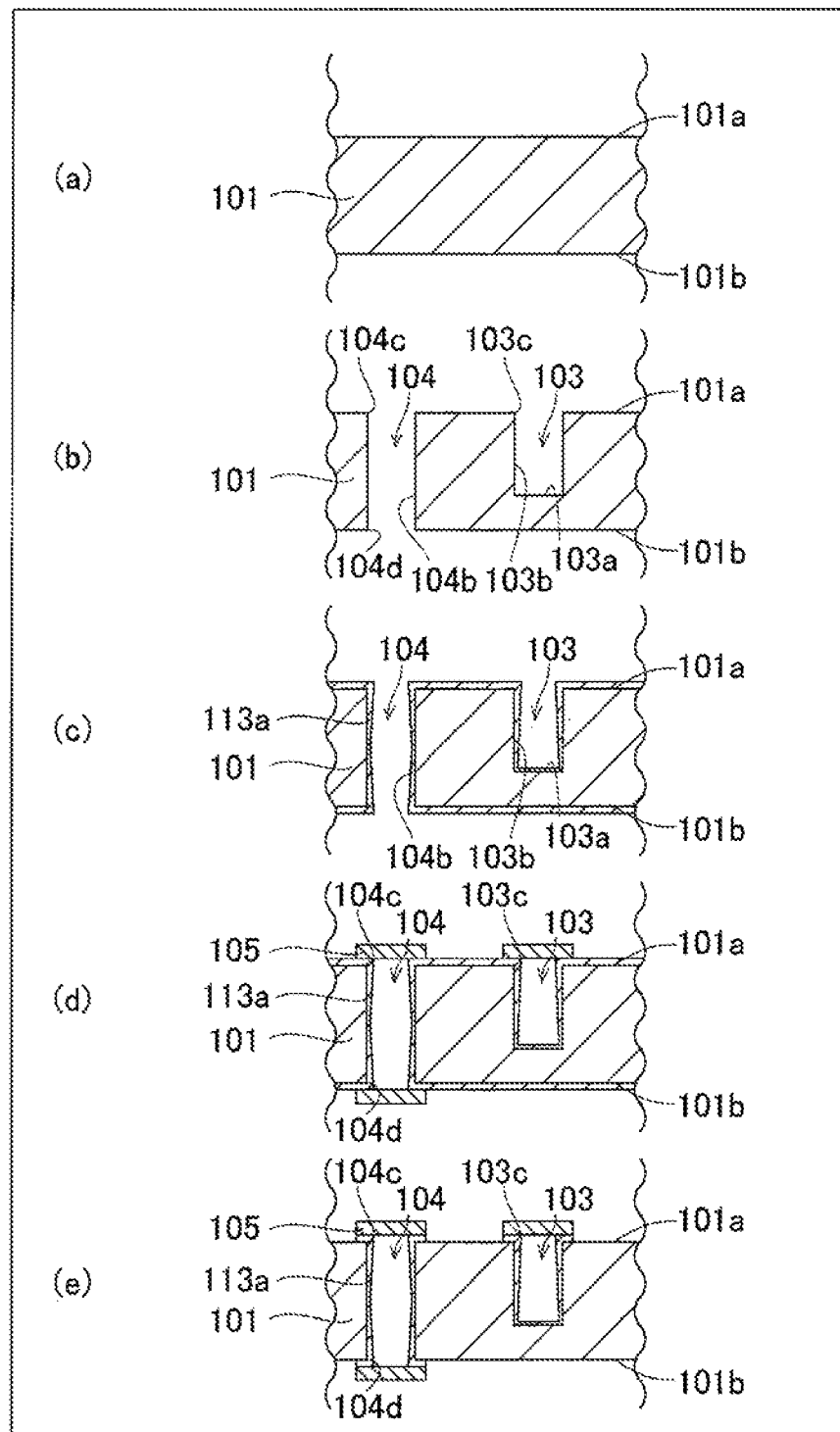
FIG. 3 provides end views of a waveguide substrate, the end views each illustrating a step of a method according to an embodiment of the present invention for producing a waveguide substrate.
Figure 4:
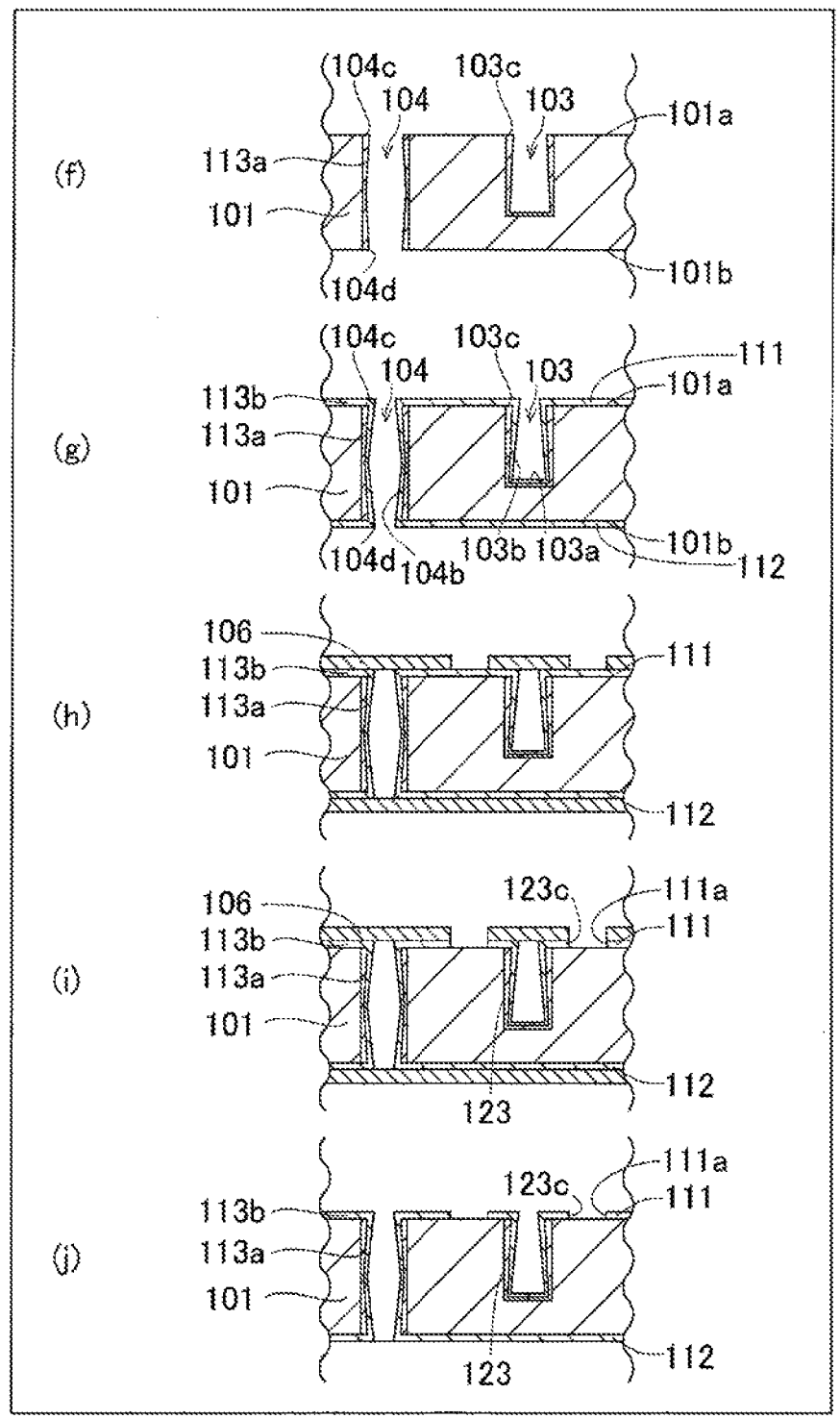
FIG. 4 provides end views of a waveguide substrate, the end views each illustrating a step of a method according to an embodiment of the present invention for producing a waveguide substrate.
Figure 5:
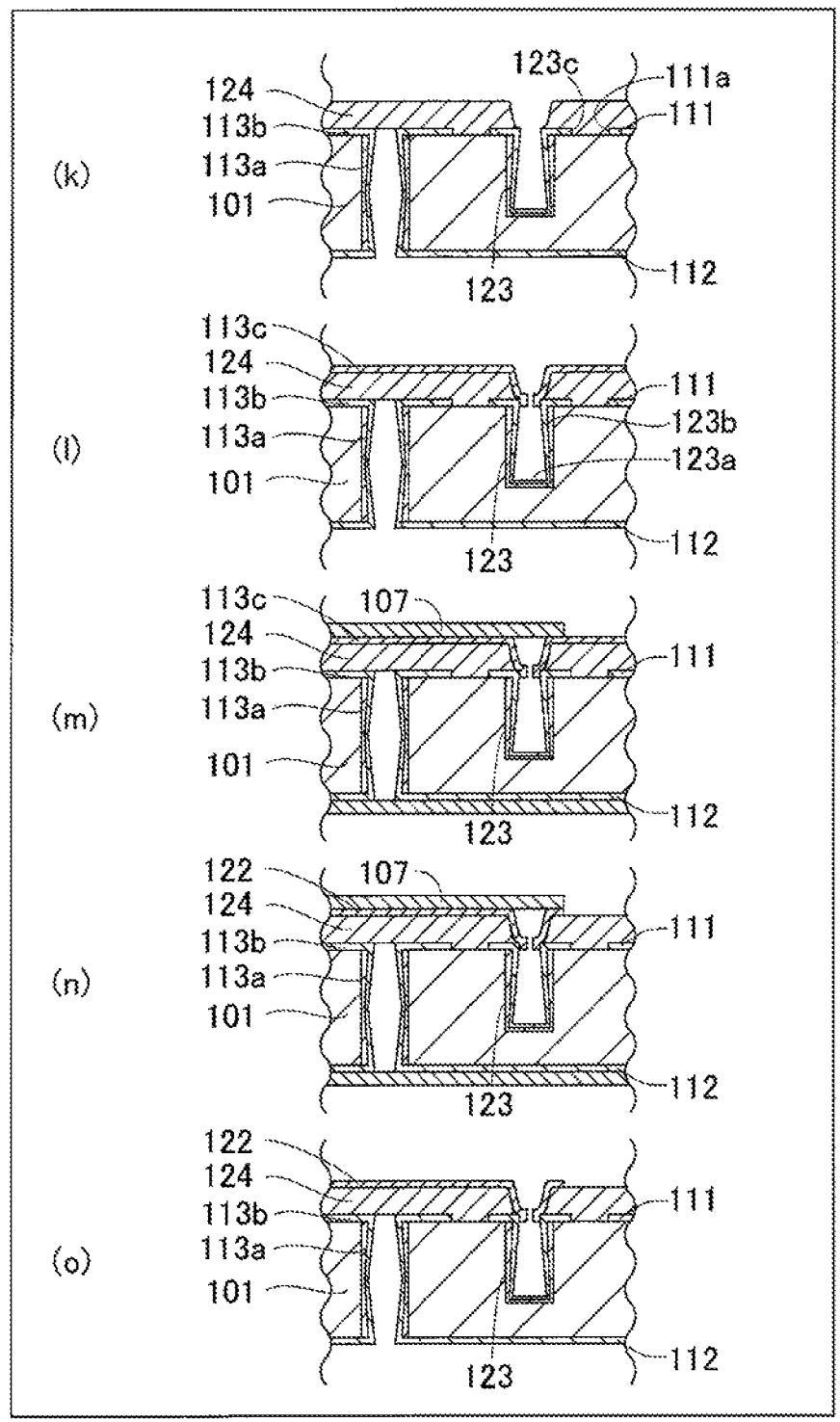
FIG. 5 provides end views of a waveguide substrate, the end views each illustrating a step of a method according to an embodiment of the present invention for producing a waveguide substrate.

The description below deals with a method for producing the waveguide substrate 100. FIGS. 3 through 5 each provide end views of a waveguide substrate 100, the end views each illustrating a method for producing the waveguide substrate 100.

First, a glass substrate (substrate) 101 is prepared (see (a) of FIG. 3). Next, a non-through hole 103 for a conductor pin and through holes 104 for conductor columns are formed in a direction from the side of an upper surface (first main surface) 101a of the glass substrate 101 to a lower surface (second main surface) 101b (see (b) of FIG. 3). The non-through hole 103 has a substantially circular opening section 103c, whereas the through holes 104 each have a substantially circular upper surface opening section 104c and a substantially circular lower surface opening section 104d. The opening section 103c of the non-through hole 103 and the upper surface opening section 104c and lower surface opening section 104d of each through hole 104 are not particularly limited in shape, and may each be in the shape of an ellipse or any other shape.

Next, a first metal film 113a made of copper is formed by sputtering from both sides, that is, from the respective sides of the upper surface 101a and the lower surface 101b, toward (i) the upper surface 101a of the glass substrate 101, (ii) a bottom surface 103a and sidewall 103b of the non-through hole 103, the bottom surface 103a and sidewall 103b serving as an inner wall of the non-through hole 103, and (iii) a sidewall 104b of the through hole 104, the sidewall 104b serving as an inner wall of the through hole 104 (see (c) of FIG. 3; first metal film forming step of the present invention). For the formation of a first metal film 113a during the first metal film forming step, the sputtering operation may be performed under any condition as long as the first metal film 113a has a predetermined thickness on the bottom surface 103a of the non-through hole 103. The first metal film 113a may be formed through a plurality of sputtering operations or through a single sputtering operation with the film formation time period adjusted. The predetermined thickness of the first metal film 113a is, for example, approximately 20 to 50 μm.

The first metal film 113a, which is made of copper, does not easily adhere to the glass substrate 101. The first metal film forming step may thus be preceded by a step of forming a thin titanium film by sputtering or the like on the surface of the glass substrate 101 as an primary metal that functions as an adhesive. Since titanium has a poorer electrical conductivity than copper, the thin titanium film needs to be as thin as possible, for example, approximately 10 to 20 μm. The material of the thin film functioning as an adhesive is selected as appropriate depending on a combination of the material of the substrate and the material of the first metal film 113a. In a case where the first metal film 113a adheres well to the substrate, there is no need to form a primary thin film that functions as an adhesive such as a thin titanium film.

Next, resist 105 is formed at the opening section 103c of the non-through hole 103 and at the upper surface opening section 104c and lower surface opening section 104d of the through hole 104 (see (d) of FIG. 3; first resist forming step [resist forming step of the present invention]). This step involves (i) placing resist in the shape of a sheet on the upper surface 101a and the lower surface 101b, on both of which the first metal film 113a has been formed, (ii) uncovering regions of the resist that correspond to the non-through hole 103 and the through hole 104, (iii) exposing those regions to light to harden the uncovered portions of the resist, and (iv) detaching the rest of the resist. This allows the resist 105 to cover the opening section 103c of the non-through hole 103 and the upper surface opening section 104c and lower surface opening section 104d of the through hole 104. The resist 105 is approximately 30 to 100 μm larger than the diameter of each of the opening section 103c of the non-through hole 103 and the upper surface opening section 104c and lower surface opening section 104d of the through hole 104.

Next, those portions of the first metal film 113a which are not covered by the resist 105 are etched away for removal (see (e) of FIG. 3; first etching step [metal film removing step of the present invention]). This step, in other words, leaves those portions of the first metal film 113a which coat the respective inner walls of the non-through hole 103 and each through hole 104 and removes those portions of the first metal film 113a which coat the upper surface 101a and lower surface 101b of the glass substrate 101.

Next, the resist 105 covering the opening section 103c of the non-through hole 103 and the upper surface opening section 104c and lower surface opening section 104d of each through hole 104 is removed with use of a parting agent (see (f) of FIG. 4; first resist removing step [resist removing step of the present invention]). This step involves removing part of those portions of the first metal film 113a which are present beneath the resist 105 (which part lies immediately outside the non-through hole 103 and the through hole 104) together with the resist 105. Subsequently, the upper surface 101a and lower surface 101b of the glass substrate 101 are washed with water for removal of the parting agent. Water on the upper surface 101a and the lower surface 101b is then removed.

Next, a second metal film 113b made of copper is formed by sputtering from both sides (that is, from the side of the upper surface 101a and the side of the lower surface 101b) on (i) the upper surface 101a of the glass substrate 101, (ii) that portion of the first metal film 113a which is on the inner wall of the non-through hole 103, and (iii) that portion of the first metal film 113a which is on the inner wall of each through hole 104 (see (g) of FIG. 4; second metal film forming step of the present invention). During the second metal film forming step, a second metal film 113b is formed with a sputtering condition adjusted so that on the bottom surface 103a of the non-through hole 103, the thickness of the second metal film 113b and the thickness of the already formed first metal film 113a are combined to provide a thickness that allows the combination of the first metal film 113a and the second metal film 113b to appropriately function as a conductor pin, that is, to ensure electrical conductivity. The thickness that allows the combination of the first metal film 113a and the second metal film 113b to appropriately function as a conductor pin is, for example, 50 to 100 μm. The sputtering operation may be performed under any condition: The second metal film 113b may be formed through a plurality of sputtering operations or through a single sputtering operation with the film formation time period adjusted.

As with the formation of the first metal film 113a, the formation of the second metal film 113b may be preceded by a step of forming a thin titanium film by sputtering or the like as an adhesive. In this case, the thin titanium film may be formed immediately after the first etching step or immediately after the first resist removing step. Further, the second metal film forming step is also similar to the first metal film forming step in that in a case where the second metal film 113b adheres well to the glass substrate 101, there is no need to form a thin film in advance that functions as an adhesive such as a thin titanium film.

Through the above steps, the second metal film 113b on the upper surface 101a of the glass substrate 101 serves as a first earth conductor layer 111; the second metal film 113b on the lower surface 101b serves as a second earth conductor layer 112; the first metal film 113a and second metal film 113b on the inner wall of the non-through hole 103 together serve as a conductor pin 123; and the first metal film 113a and second metal film 113b on the inner wall of each through hole 104 together serve as a conductor column 114.

Next, resist 106 is formed in such a manner that those regions which correspond to the openings of the first earth conductor layer 111 are uncovered (see (h) of FIG. 4; second resist forming step). The second resist forming step uses a method similar to that for the first resist forming step.

Next, those portions of the second metal film 113b which are present in respective regions corresponding to the openings of the first earth conductor layer 111 are etched away for removal (see (i) of FIG. 4; second etching step). This allows a land 123c to be formed that is electrically not connected to the opening 111a of the first earth conductor layer 111 or to the first earth conductor layer 111.

Next, the resist 106 is removed, and a parting agent and water are then removed as in the first resist removing step (see (j) of FIG. 4; second resist removing step).

Next, an insulating portion 124 is formed on the first earth conductor layer 111, the opening 111a, and the land 123c (see (k) of FIG. 5): First, photosensitive resin in a liquid state, for example, is applied by spin coating to the entire surface on the side of the first earth conductor layer 111. Then, that portion of the photosensitive resin which is near the opening of the conductor pin 123 is removed by photolithography. The remaining photosensitive resin is heat-treated to be hardened, forming an insulating portion 124. In a case where a portion of the photosensitive resin is not removed and remains near the opening of the conductor pin 123, such a remaining portion is preferably removed by a reactive ion etching (RIE) process involving use of $CF_4$ gas or $O_2$ gas.

Next, a transmission line 122 is formed: First, a third metal film 113c is formed on the insulating portion 124 by sputtering (see (1) of FIG. 5; third metal film forming step). The third metal film 113c simply needs to be electrically connected to that portion of the conductor pin 123 which is on the side of the base end 123b. The third metal film 113c is not necessarily present deep at a far end (bottom surface) 123a of the conductor pin 123.

Next, resist 107 is formed in a region corresponding to the transmission line 122 (see (m) of FIG. 5; third resist forming step). The third resist forming step uses a method similar to those for the first resist forming step and the second resist forming step.

Next, those portions of the third metal film 113c which are not covered by the resist 107 are etched away for removal (see (n) of FIG. 5; third etching step). This forms a transmission line 122.

Next, the resist 107 is removed, and a parting agent and water are then removed as in the first resist removing step and the second resist removing step (see (o) of FIG. 5; third resist removing step).

The production method illustrated in FIGS. 3 through 5 allows a waveguide substrate 100 to be produced as described above.

[Effects]

Figure 6:
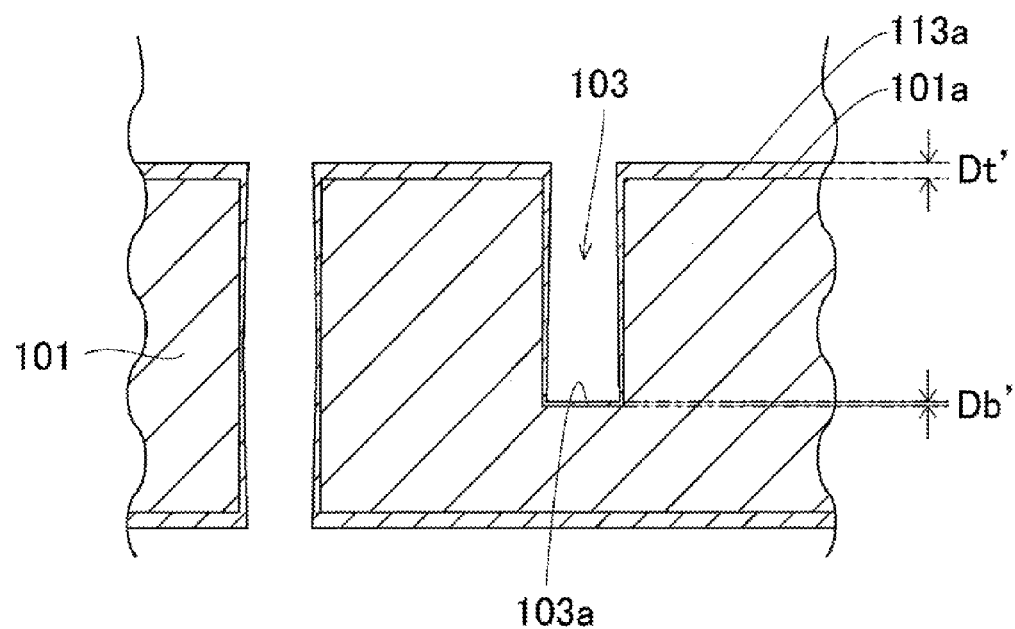
FIG. 6 is an end view of a waveguide substrate as a comparative example.

The description below deals with working effects of the method according to the present embodiment for producing a waveguide substrate 100. Typically, in a case where a first metal film 113a is formed simultaneously on both the upper surface 101a and lower surface 101b of a glass substrate 101 having a non-through hole 103 by sputtering as illustrated in (c) of FIG. 3, that portion of the first metal film 113a which is on the upper surface 101a has a thickness Dt', whereas that of the first metal film 113a which is on the bottom surface 103a of the non-through hole 103 has a thickness Db', the thickness Dt' being larger than the thickness Db' as illustrated in FIG. 6. In other words, that portion of the first metal film 113a which is on the inner wall, in particular the bottom surface 103a, of the non-through hole 103 is thinner than that portion of the first metal film 113a which is on the upper surface 101a of the glass substrate 101. That portion of the first metal film 113a which is on the bottom surface 103a needs to have a thickness that is large to an extent in order for the non-through hole 103 to function as a conductor pin 123.

In view of that, the method according to the present embodiment for producing a waveguide substrate 100 first involves a first metal film forming step of forming a first metal film by sputtering on (i) the upper surface 101a and lower surface 101b of a glass substrate 101 having a non-through hole 103 and (ii) the inner wall of the non-through hole 103. Through this step, that portion of the first metal film 113a which is on the inner wall, in particular the bottom surface 103a, of the non-through hole 103 is thinner than that portion of the first metal film 113a which is on the upper surface 101a and lower surface 101b of the glass substrate 101. The method further involves forming resist 105 on the side of the upper surface 101a of the glass substrate 101 in such a manner as to block the opening of the non-through hole 103 (resist forming step), removing that portion of the first metal film 113a which is on the upper surface 101a and lower surface 101b of the glass substrate 101 (metal film removing step), and then removing the resist (resist removing step). Thus, the glass substrate 101 after the resist removing step is such that the first metal film 113a is absent on the upper surface 101a and the lower surface 101b, whereas the first metal film 113a remains on the inner wall of the non-through hole 103. The method then involves forming a second metal film by sputtering on the upper surface 101a and lower surface 101b of the glass substrate 101 with the first metal film 113a present on the inner wall of the non-through hole 103 (second metal film forming step). The method thus makes it possible to form, on the inner wall of the non-through hole 103 (on which a relatively thin metal film is formed through a single sputtering step, that is, the first metal film forming step), two layers of metal films (namely, the first metal film 113a and the second metal film 113b; conductor pin 123) through two sputtering steps (first metal film forming step and second metal film forming step). The method also makes it possible to form, on a first main surface (on which a relatively thick metal film is formed through a single sputtering step), a single layer of metal film (second metal film 113b; the first earth conductor layer and the second earth conductor layer) through a single sputtering step (second metal film forming step). The method therefore makes it possible to (i) ensure a sufficient thickness for the metal film near the bottom surface 103a of the non-through hole 103 and (ii) form a metal film with a thickness that prevents the metal film from being peeled from a substrate surface.

The first metal film forming step illustrated in (c) of FIG. 3 involves film-forming sputtering operations repeated until that portion of the first metal film 113a which is on the bottom surface 103a of the non-through hole 103 has a predetermined thickness. In a case where that portion of the first metal film 113a which is formed on the bottom surface 103a of the non-through hole 103 during the first metal film forming step has a thickness that allows the above portion of the first metal film 113a alone to ensure electrical conductivity as a conductor pin 123, the second metal film forming step illustrated in (g) of FIG. 4 involves no need to consider the thickness of the second metal film 113b on the bottom surface 103a of the non-through hole 103 and can simply involve forming a second metal film 113b having a smallest possible thickness on the upper surface 101a of the glass substrate 101.

The method according to the present embodiment reliably allows that portion of the second metal film 113b which is on the upper surface 101a of the glass substrate 101 to have a small thickness as described above. The method thus prevents the second metal film 113b from being peeled easily from the upper surface 101a of the glass substrate 101.

The present embodiment is configured to include a glass substrate as its substrate, but may be configured to include a silicon substrate as its substrate for a waveguide substrate 100. In a case where a metal film is formed on a silicon substrate by sputtering, that metal film is preferably made of Cu as a metal material or is preferably made of TiW as a metal material that functions as an adhesive. The first metal film 113a, the second metal film 113b, and the adhesive are each made of a material selected as appropriate depending on the material of the substrate as described above.

As described above, a method according to an aspect of the present invention for producing a waveguide substrate includes a first metal film forming step of forming a first metal film by sputtering on (i) a first main surface of a substrate, at which first main surface a non-through hole opens, and on (ii) an inner wall of the non-through hole, a resist forming step of forming resist on a first main surface side of the substrate in such a manner that the resist blocks the opening of the non-through hole, a metal film removing step of removing a first portion of the first metal film which first portion is on the first main surface, a resist removing step of removing the resist, and a second metal film forming step of forming a second metal film by sputtering on the first main surface of the substrate in a state where the first metal film is present on the inner wall of the non-through hole.

The above configuration allows a metal film to have a sufficient thickness around a bottom surface of a non-through hole and prevents the metal film from being peeled from a substrate surface.

[Recap]

A method according to an aspect of the present invention for producing a waveguide substrate is a method for producing a waveguide substrate, the waveguide substrate including: a substrate; a first earth conductor layer on a first main surface of the substrate; a second earth conductor layer on a second main surface of the substrate; a plurality of conductor columns disposed on respective inner walls of a plurality of through holes between the first earth conductor layer and the second earth conductor layer; a plane circuit for signal propagation which plane circuit is disposed on the first main surface of the substrate; and a conductor pin on an inner wall of a non-through hole opening at the first main surface of the substrate, the conductor pin being connected to the plane circuit, the method including: a first metal film forming step of forming a first metal film by sputtering on (i) the first main surface of the substrate, at which first main surface the non-through hole opens, and on (ii) the inner wall of the non-through hole; a resist forming step of forming resist on a first main surface side of the substrate in such a manner that the resist blocks the opening of the non-through hole; a metal film removing step of removing a first portion of the first metal film which first portion is on the first main surface; a resist removing step of removing the resist; and a second metal film forming step of forming a second metal film by sputtering on the first main surface of the substrate in a state where the first metal film is present on the inner wall of the non-through hole.

A method according to an aspect of the present invention for producing a waveguide substrate is a method for producing a waveguide substrate, the waveguide substrate including: a substrate; a first earth conductor layer on a first main surface of the substrate; a second earth conductor layer on a second main surface of the substrate; a plurality of conductor columns disposed on respective inner walls of a plurality of through holes between the first earth conductor layer and the second earth conductor layer; a plane circuit for signal propagation which plane circuit is disposed on the first main surface of the substrate; and a conductor pin on an inner wall of a non-through hole opening at the first main surface of the substrate, the conductor pin being connected to the plane circuit, the method including: a first metal film forming step of forming a first metal film by sputtering on (i) the first main surface of the substrate, at which first main surface the non-through hole opens, and on (ii) the inner wall of the non-through hole. Through this step, that portion of the first metal film which is on the inner wall, in particular the bottom surface, of the non-through hole is thinner than that portion of the first metal film which is on the first main surface of the substrate. The method further includes a resist forming step of forming resist on a first main surface side of the substrate in such a manner that the resist blocks the opening of the non-through hole, a metal film removing step of removing a first portion of the first metal film which first portion is on the first main surface, and a resist removing step of removing the resist. Thus, the substrate after the resist removing step is such that the first metal film is absent on the first main surface, whereas the first metal film remains on the inner wall of the non-through hole. The method further includes a second metal film forming step of forming a second metal film by sputtering on the first main surface of the substrate in a state where the first metal film is present on the inner wall of the non-through hole. The method thus makes it possible to form, on the inner wall of the non-through hole (on which a relatively thin metal film is formed through a single sputtering step), metal films (conductor pin) through two sputtering steps and to form, on the first main surface (on which a relatively thick metal film is formed through a single sputtering step), a metal film (first earth conductor layer) through a single sputtering step. The method therefore allows the metal film to have a sufficient thickness around the bottom surface of the non-through hole and to have a thickness that prevents the metal film from being peeled from the substrate surface.

The method according to an aspect of the present invention for producing a waveguide substrate may be arranged such that in the first metal film forming step, the first metal film is also formed by sputtering on the second main surface of the substrate and on the respective inner walls of the plurality of through holes; in the resist forming step, the resist is also formed on both sides of the substrate in such a manner as to block openings of the plurality of through holes; in the metal film removing step, a second portion of the first metal film which second portion is on the second main surface is also removed; and in the second metal film forming step, the second metal film is also formed by sputtering on the second main surface of the substrate and on the respective inner walls of the plurality of through holes.

The present invention is not limited to the description of the embodiments above, but may be altered by a skilled person within the scope of the claims. Any embodiment based on a proper combination of technical means disclosed in different embodiments is also encompassed in the technical scope of the present invention.

REFERENCE SIGNS LIST 1 glass substrate
101a upper surface
101b lower surface 102 opening section
103 non-through hole
103a bottom surface
103b sidewall
103c opening section
104 through hole
104b sidewall
104c upper surface opening section
104d lower surface opening section
105, 106, 107 resist
110 waveguide
111 first earth conductor layer
111a opening
112 second earth conductor layer
113a first metal film
113b second metal film
113c third metal film
114 conductor column
115 opposite side surface
116 first end surface
117 second end surface
122 transmission line
123 conductor pin
123a bottom part
123b base end
123c land
124 insulating portion

The invention claimed is:

1. A method for producing a waveguide substrate, the waveguide substrate including:

a substrate;
a first earth conductor layer on a first main surface of the substrate;
a second earth conductor layer on a second main surface of the substrate;
a plurality of conductor columns disposed on respective inner walls of a plurality of through holes between the first earth conductor layer and the second earth conductor layer;
a plane circuit for signal propagation which plane circuit is disposed on the first main surface of the substrate; and
a conductor pin on an inner wall of a non-through hole opening at the first main surface of the substrate, the conductor pin being connected to the plane circuit,
the method comprising:
a step of forming, in a direction from the first main surface of the substrate to the second main surface of the substrate, (i) the non-through hole for the conductor pin and (ii) the plurality of through holes for the plurality of conductor columns;
a first metal film forming step of forming a first metal film by sputtering on (i) the first main surface of the substrate, at which first main surface the non-through hole opens, and on (ii) the inner wall of the non-through hole;
a resist forming step of forming resist on a first main surface side of the substrate in such a manner that the resist blocks the opening of the non-through hole;
a metal film removing step of removing a first portion of the first metal film which first portion is on the first main surface;
a resist removing step of removing the resist; and
a second metal film forming step of forming a second metal film by sputtering on the first main surface of the substrate in a state where the first metal film is present on the inner wall of the non-through hole.

2. The method according to claim 1,
wherein:
in the first metal film forming step, the first metal film is also formed by sputtering on the second main surface of the substrate and on the respective inner walls of the plurality of through holes;
in the resist forming step, the resist is also formed on both sides of the substrate in such a manner as to block openings of the plurality of through holes;
in the metal film removing step, a second portion of the first metal film which second portion is on the second main surface is also removed; and
in the second metal film forming step, the second metal film is also formed by sputtering on the second main surface of the substrate and on the respective inner walls of the plurality of through holes.

3. The method according to claim 1,
wherein:
in the first metal film forming step, the first metal film, formed on a bottom surface of the non-through hole, has such a thickness that allows for ensuring electrical conductivity alone as a conductive pin.

4. The method according to claim 1, wherein the metal film removing step is performed after the resist forming step and before the second metal film forming step.

* * * * *